United States Patent
Luo

(10) Patent No.: US 6,319,102 B1
(45) Date of Patent: Nov. 20, 2001

(54) CAPACITOR COUPLED CHUCK FOR CARBON DIOXIDE SNOW CLEANING SYSTEM

(75) Inventor: Jih-Shiuan (Sam) Luo, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/350,776

(22) Filed: Jul. 9, 1999

(51) Int. Cl.[7] .......................................................... B24C 5/04
(52) U.S. Cl. .............................. 451/102; 361/234; 134/72
(58) Field of Search .................................. 361/230, 233, 361/234, 235; 134/6, 7, 9, 26, 902, 31, 72; 279/128, 157, 43.9, 43.3; 29/825, 829, 830; 451/102

(56) References Cited

U.S. PATENT DOCUMENTS

| | | |
|---|---|---|
| 4,562,510 | 12/1985 | Forry et al. . |
| 4,974,375 * | 12/1990 | Tada ........................................ 51/413 |
| 5,125,979 | 6/1992 | Swain et al. . |
| 5,190,064 * | 3/1993 | Aigo ....................................... 134/84 |
| 5,294,261 | 3/1994 | McDermott et al. . |
| 5,364,472 * | 11/1994 | Heyns ...................................... 134/7 |
| 5,409,418 * | 4/1995 | Krone-Schmidt ...................... 451/75 |
| 5,421,766 * | 6/1995 | Shank ..................................... 451/75 |
| 5,565,179 | 10/1996 | Douglas . |
| 5,584,938 | 12/1996 | Douglas . |
| 5,601,478 * | 2/1997 | Mesher ................................... 451/75 |
| 5,636,098 * | 6/1997 | Salfelder ............................... 361/234 |
| 5,651,834 * | 7/1997 | Jon ......................................... 134/31 |
| 5,769,991 * | 6/1998 | Miyazawa ............................. 156/153 |
| 5,780,563 * | 7/1998 | Chen ..................................... 526/130 |
| 5,806,544 | 9/1998 | Kosic . |
| 5,837,064 | 11/1998 | Bowers . |
| 5,853,962 | 12/1998 | Bowers . |
| 5,870,271 * | 2/1999 | Herchen ............................... 361/234 |
| 5,986,875 * | 11/1999 | Donde ................................... 361/234 |
| 5,996,218 * | 12/1999 | Shamoilian ............................ 29/825 |
| 6,023,405 * | 2/2000 | Shamouilian ........................ 361/234 |
| 6,110,278 * | 8/2000 | Saxena ................................. 117/95 |
| 6,125,025 * | 9/2000 | Howald ............................... 361/234 |

* cited by examiner

Primary Examiner—Lee Young
Assistant Examiner—Sean Smith
(74) Attorney, Agent, or Firm—Robert O. Guillot; Oppenheimer Wolff & Donnelly LLP

(57) ABSTRACT

The cryogenic aerosol substrate cleaning system of the present invention includes a substrate support system that is disposed within a cleaning enclosure. A wafer, or other article to be cleaned is disposed upon the substrate support system. A cryogenic aerosol spray cleaning device is disposed within the enclosure to direct a cryogenic aerosol spray upon the surface of the wafer. The substrate support system includes an electrically floating chuck which supports the wafer, such that the chuck is separated from a grounded plane by an insulator. The chuck is capacitance-coupled to the grounded plane, and in alternative embodiments the chuck is also electrically coupled to the grounded plane. The substrate support system of the present invention acts to reduce the creation of tribocharges on the wafer, such that damage to wafers caused by such tribocharges is reduced and a cleaner wafer surface is created.

19 Claims, 2 Drawing Sheets

CAPACITOR COUPLED CHUCK FOR CARBON DIOXIDE SNOW CLEANING SYSTEM

BACKGROUND OF THE INVENTION

1. Field of the Invention

The present relates generally to devices that utilize a cryogenic aerosol spray to remove particulates from substrates and the like, and more particularly to devices and methods for reducing the effect of tribocharges that may occur during such a spray cleaning operation.

2. Description of the Prior Art

The removal of micron-sized contaminating particulates from the surfaces of substrates is a significant problem encountered in the semiconductor fabrication industry, as well as other industries where micron-sized particulates are of concern. One system for the removal of such particulates utilizes a cryogenic aerosol spray, typically carbon dioxide, that is sprayed onto the substrate surface. The cryogenic aerosol is sprayed from a nozzle in a high speed liquid stream and forms solid particulates, termed a snow, following emission from the nozzle. The snow and perhaps some liquid impact the contaminating particulates to mechanically remove them from the substrate surface to clean the surface.

A significant problem of electrostatic charge build-up has been encountered utilizing the cryogenic aerosol cleaning methods. Particularly, because the material that comprises the cryogenic aerosol, typically carbon dioxide, and the material of the substrate surface, such as a metal, or an insulator, differ with regard to their position on the triboelectric scale (also known as the "work function"), a significant triboelectric charge or tribocharge can be created during the cleaning process. The tribocharge can result in significant electric fields and electrostatic discharge which can damage sensitive components of the substrate.

One solution to this problem has been to ground the metal chuck which supports the substrate within a cleaning system. However, the inventors have discovered that the grounded chuck does not adequately resolve the tribocharge build-up. A need therefore exists or an improved device and system for reducing the effects of tribocharges during a cryogenic aerosol, spray cleaning operation.

SUMMARY OF THE INVENTION

The cryogenic aerosol substrate cleaning system of the present invention includes a substrate support system that is disposed within a cleaning enclosure. A wafer, or other article to be cleaned is disposed upon the substrate support system. A cryogenic aerosol spray cleaning device is disposed within the enclosure to direct a cryogenic aerosol spray upon the surface of the wafer. The substrate support system includes an electrically floating chuck which supports the wafer, such that the chuck is separated from a grounded plane by an insulator. The chuck is capacitance-coupled to the grounded plane, and in alternative embodiments the chuck is also electrically coupled to the grounded plane. The substrate support system of the present invention acts to reduce the creation of tribocharges on the wafer, such that damage to wafers caused by such tribocharges is reduced and a cleaner wafer surface is created.

It is an advantage of the present invention that it provides an apparatus and method for protecting static-sensitive devices from damage due to electrostatic discharge when they are cleaned using a carbon dioxide spray cleaning system.

It is another advantage of the present invention that it provides a substrate support system for use in a cryogenic aerosol spray cleaning enclosure which reduces the effects of tribocharges created during aerosol spray cleaning, resulting in a cleaner more defect free substrate.

It is a further advantage of the present invention that it provides a substrate support system for use in a cryogenic aerosol spray cleaning device, having a floating chuck that is capacitance-coupled to a grounded plane member, whereby the effects of tribocharges are reduced.

It is yet another advantage of the present invention that it provides a substrate support system for use in a cryogenic aerosol spray cleaning device that has a floating chuck that is both capacitance-coupled and electrically coupled to a grounded plane member, whereby the effects of tribocharges are reduced.

It is yet a further advantage of the present invention that it provides a means for the reduction of tribocharges, whereby ionizers are more effectively utilized.

These and other objects and advantages of the present invention will become fully understood by those skilled in the art upon review of the following detailed description which makes reference to the several figures of the drawings.

IN THE DRAWINGS

DETAILED DESCRIPTION OF THE PREFERRED EMBODIMENTS

Figure 1:
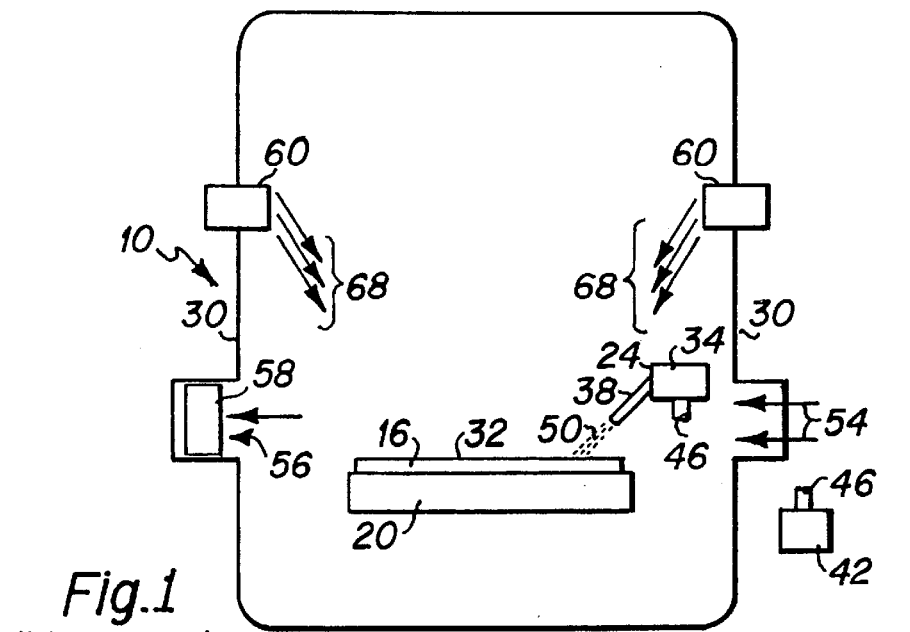
FIG. 1 depicts a prior art cryogenic aerosol cleaning device.
Figure 2:
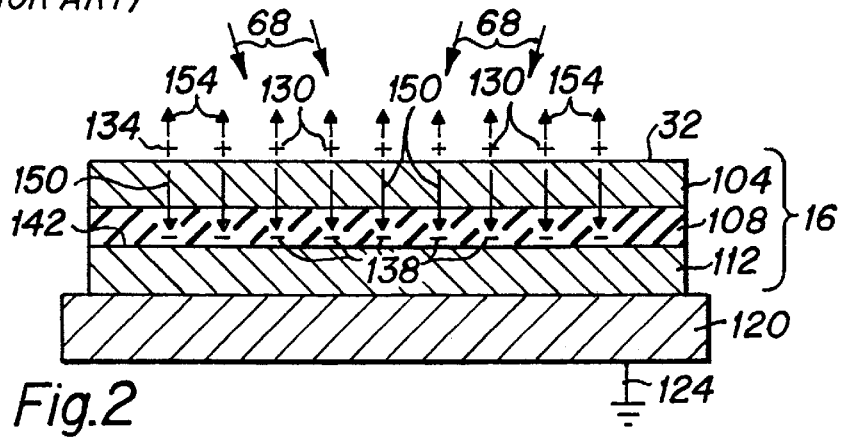
FIG. 2 is a side cross-sectional view of the wafer and grounded chuck of the device depicted in FIG. 1.

A prior art cryogenic aerosol cleaning device 10 is depicted in FIGS. 1 and 2, wherein FIG. 1 depicts significant features of the cleaning device 10 and FIG. 2 is a side cross-sectional view of a substrate 16, such as a semiconductor wafer, disposed upon a grounded substrate support member 20, termed a chuck, of the device 10 depicted in FIG. 1. A typical cryogenic aerosol spray cleaning system 24, such as an ECO-SNOW carbon dioxide system manufactured by Eco-Snow Systems, Inc., Livermore, Calif., U.S.A., is used in conjunction with a controlled, ultra pure, environmental process enclosure 30 to remove unwanted particulate material from the outer surface 32 of the wafer 16, as is described in U.S. Pat. No. 5,853,962 assigned to Eco-Snow Systems, Inc.

The cryogenic aerosol jet spray cleaning system 24 includes a delivery system 34 for the cryogenic aerosol, such as carbon dioxide, that includes a valve and nozzle assembly 38 disposed in the environmental process enclosure 30. Carbon dioxide is provided to the delivery system 34 from a carbon dioxide tank 42 through tubing 46. The carbon dioxide snow spray 50 is produced by feeding liquid carbon dioxide from the pressurized tank 42 to the valve and nozzle assembly 38 which emits the snow spray 50 that is directed onto the surface 32 of the wafer 16. A snow spray 50 (containing many high speed gas or snow particles) is optimally oriented at an angle of between 30 and 45 degrees with respect to the surface 32 of the wafer 16. A laminar flow (arrows 54) gas source is used to carry removed particulates from the surface 32 of the wafer 16 to an exhaust 56 that typically includes a filter 58 and a gas recycling system (not shown).

It is known that cryogenic aerosol spray cleaners can generate a static charge, known as a tribocharge, on components of the wafer surface during cleaning, because materials that comprise the surface of the components charge in accordance with their relative positions on the triboelectric scale relative to the position of the aerosol spray on the triboelectric scale. Insulator materials, such as Teflon for example, can have thousands of volts of tribocharge build-up after $CO_2$ cleaning, while metals tend to have much less tribocharge build-up. A significant tribocharge build-up can create internal electric fields and voltages within the wafer that can alter and damage sensitive components of the wafer. The tribocharge build-up can also hinder removal of the contaminating particles from the surface of the component by the cryogenic aerosol spray, because the tribocharge build-up increases the attraction between the surface of the component and the contaminating particles that the cryogenic aerosol spray is intended to remove. It is therefore desirable to eliminate the tribocharge build-up on the wafer surface 32 during a cryogenic aerosol spray cleaning. An attempt to solve this problem is by applying a charge to the snow particulate, as is described in U.S. Pat. No. 5,837,064 assigned to Eco-Snow Systems, Inc. Another method of attempting to solve the tribocharge problem during a cryogenic aerosol spray cleaning process is by utilizing a shower of ions generated by a corona discharge system, as is taught in U.S. Pat. No. 5,584,938. By way of example, as depicted in FIG. 1, one or more corona discharge systems 60 are installed within the chamber 30. The corona discharge systems 60 function to generate a directed shower of ions, shown as arrows 68, towards the surface 32 of the wafer 16 to neutralize the tribocharges. It is preferable that the corona discharge system 60 be capable of generating both positively charged ions and negatively charged ions because tribocharges on the wafer surface may be positive or negative depending upon the relative position of materials on the triboelectric scale, as discussed hereabove, and it is the purpose of the ions to neutralize the tribocharge.

The tribocharge build-up during $CO_2$ spray cleaning of the substrate surface can be particularly large where the chuck supporting the substrate is grounded, as is found in prior art devices. Specifically, a typical wafer 16, as is depicted with an enlarged thickness for ease of comprehension in FIG. 2, has layers including an outer coating layer 104, which may include insulative and/or conductive portions, an underlayer 108, which is an insulator and a substrate layer 112 which is typically conductive. The wafer 16 is disposed upon a chuck 120 that is grounded 124. Tribocharges 130 (indicated in FIG. 2 as positive) are created in a layer 134 on the outer surface 32 of the outer layer 104 by the spray cleaning process. Significantly, the electrostatic energy of the positively tribocharged layer 134 causes an induced negatively charged mirror layer 138 to be created on the opposite surface 142 of the insulator layer 108, and an electrostatic field (arrows 150) is created between the tribocharged layer 134 and the induced charged layer 138. The electric field (arrows 154) that emanates outwardly from the outer surface 32 is therefore significantly reduced by the electric field 150. As a result, negative ions 68 which are generated by the corona discharge devices to quench or neutralize the tribocharged layer 134 are not particularly drawn to the tribocharged layer 134 due to the weak field 154. Thus, the prior art device with its grounded chuck 120 is not particularly effective to neutralize the tribocharged layer 134, and a significant voltage can be created within the wafer 16 which can cause significant damage to it. The present invention eliminates the grounded chuck 120 of the prior art device and thereby produces a significant reduction in surface tribocharges, as is next described.

Figure 3:
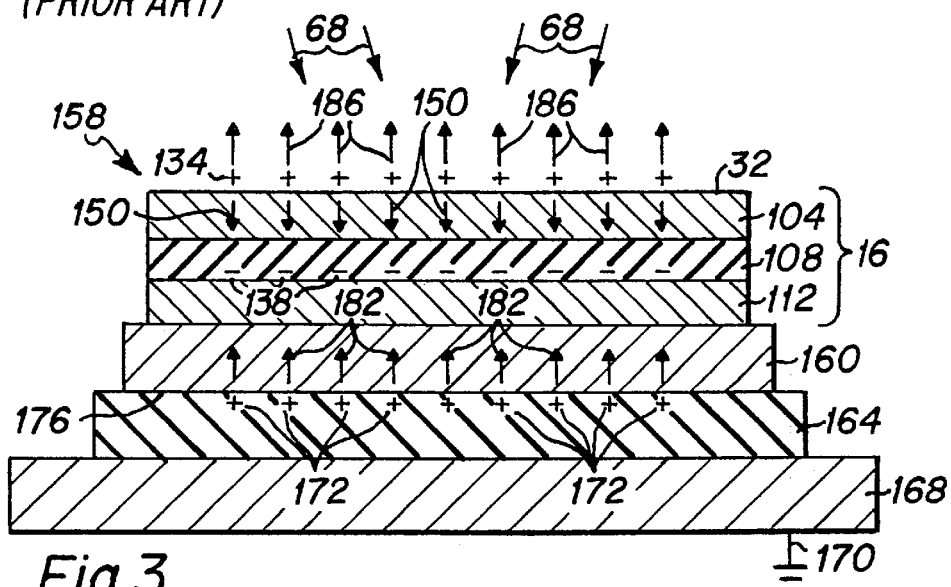
FIG. 3 is a side cross-sectional view of an embodiment of the present invention depicting a substrate support system having an electrically floating chuck.

A side cross-sectional view of a first preferred embodiment 158 of the present invention is depicted in FIG. 3, wherein a substrate member 16, such as a semiconductor wafer, a hard disk, or almost any other object requiring cleaning, all cumulatively referred to as a wafer 16, is disposed upon a chuck 160 that is disposed on an insulator 164 which is disposed upon a grounded plane 168 by ground 170. The chuck 160 is therefore electrically floating relative to the grounded plane 168. As with the embodiment depicted in FIG. 2, the surface tribocharge layer 134 electrostatically induces a negatively charged mirror layer 138 within the insulator layer 108. However, because the chuck 160 is floating, the negatively charged induced layer 138 likewise electrostatically induces positive mirror charges 172 in the surface 176 of the insulator 164. A second electrostatic field (arrows 182) is thereby created between the induced positive charges 172 and the induced negative charges 138. The electrostatic field 150 between the positive tribocharges 134 and the negative induced charges 138 also still exists, however the electrostatic field 150 is weakened due to the creation of the electrostatic field 182. As a result, the electrostatic field 186 which emanates outwardly from the wafer's outer surface 32 is stronger than the field 154 that is created when the chuck 120 is grounded, as depicted in FIG. 2 and described hereabove. Negatively charged ions 68 are therefore drawn more readily by the stronger electrostatic field 186 to the surface 32 to quench or neutralize the tribocharges in the tribocharge layer 134. For effective neutralization, it is important that the metal chuck 160 be capacitance-coupled relative to the ground plane 168 during cleaning, and the capacitance of the chuck relative to ground should be 20 pF or less, and preferably in a range of 20 pF to 0.2 pF. The present invention, as depicted in FIG. 3, therefore serves to reduce the deleterious effects of tribocharges created during the $CO_2$ spray cleaning operation.

Figure 4:
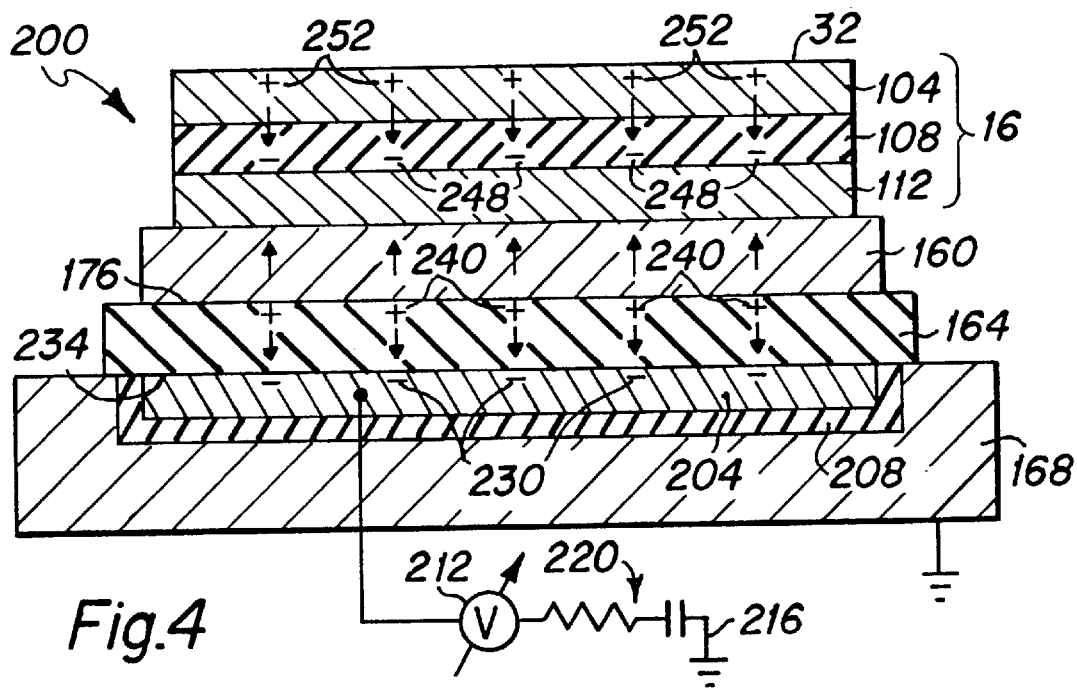
FIG. 4 is a side cross-sectional view of a capacitance coupled and electric field coupled chuck of the present invention.

FIG. 4 is a side cross-sectional view of a second embodiment 200 of the present invention, wherein a wafer 16 is disposed upon a floating chuck 160 which is disposed upon an insulator 164. The insulator is disposed upon a chargeable plate 204 that is separated from the grounded plane 168 by an insulator layer 208. A variable voltage creating source 212 is connected to the plate 204 and to ground 216 through a suitable resistance and capacitance that form an R-C circuit 220. It is therefore to be understood that a preselected, or controllable variable bias Voltage "V" can be applied to the plate 204 prior to or during the spray cleaning operation. The application of a biasing voltage V results in the chuck 16 being electrically coupled to the grounded plane 168. As with the embodiment 158 depicted in FIG. 3, it is important that the metal chuck 160 be capacitance-coupled relative to the ground plane 168, and in the preferred embodiment, the capacitance of the chuck 160 relative to ground 168 should be in the range of 20 pF to 0.2 pF with a preferred value of approximately 20 pF or less.

Advantageously, as depicted in FIG. 4, prior to the commencement of a spray cleaning operation, a negative charge 230 can be created upon the surface 234 of the plate 204 utilizing the variable voltage device 212. The negative charges 230 electrostatically induce positive mirror charges 240 in the surface 176 of the insulator 164. The positive charges 240 thereafter electrostatically induce negative mirror charges 248 within the insulator layer 108, which thereafter electrostatically induce positive mirror charges 252 in the surface 32 of the wafer coating layer 104. That is, prior to the initiation of the spray cleaning operation, the wafer outer surface 32 is positively charged. Thereafter, during the spray cleaning operation, the surface 32 does not attract or develop Tribocharges to the same degree as are created when the wafer surface 32 is not pre-charged, as is the case with the embodiment depicted in FIG. 3 and described hereinabove. It is believed that the pre-charging of the wafer surface causes a change in the location on the triboelectric scale of the materials that comprise the surface of the components of the wafer. As a result, the triboelectric charge build-up, which is a function of the relative positioning of the material and the carbon dioxide spray on the triboelectric scale, is reduced. Ion showering from the corona charge systems 60 is still utilizable to neutralize any tribocharge build-up that does occur. The embodiment 200 therefore provides a two-step approach to the tribocharge problem in snow cleaning systems. The first step is to provide an appropriately charged component surface, such that the creation of tribocharges is inhibited, and the second step is to supply an ion shower or other process to neutralize tribocharges that may still occur.

Figure 5:
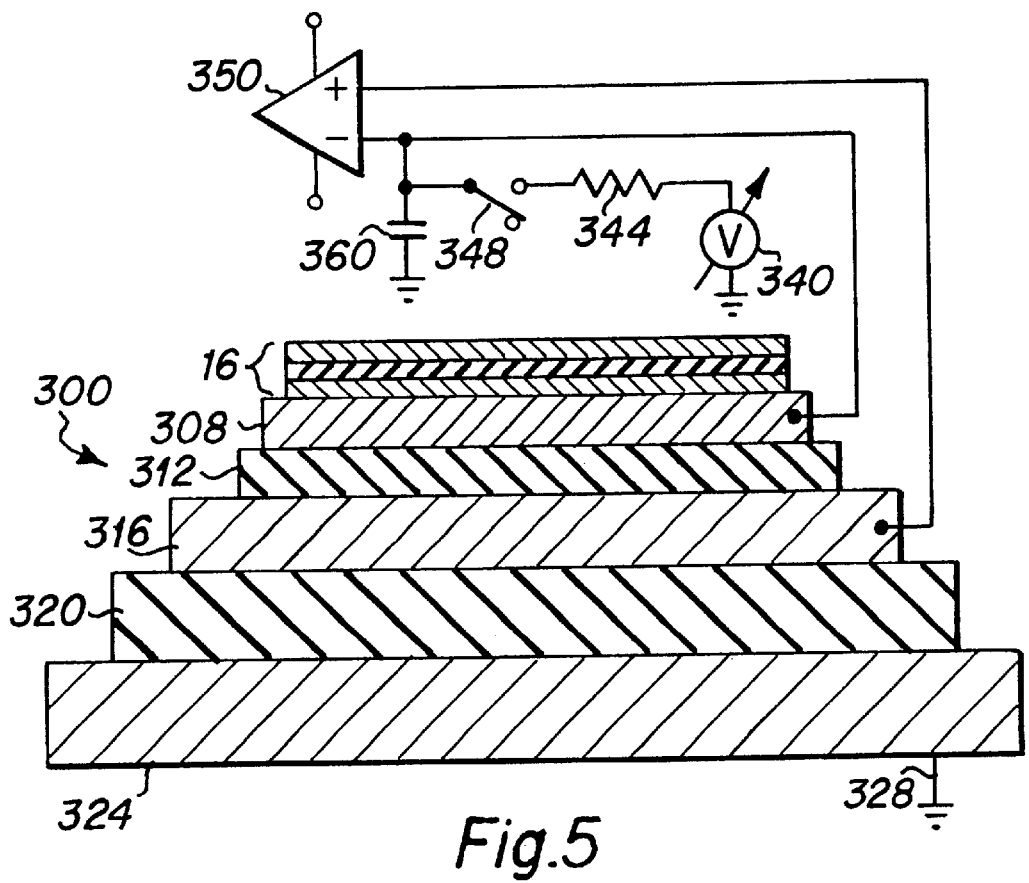
FIG. 5 is a side cross-sectional view of an alternative capacitance coupled and electric field coupled chuck of the present invention.

FIG. 5 is a cross-sectional view of a further embodiment 300 of the present invention, wherein a wafer 16 is disposed upon a chuck 308 which is disposed upon an insulator 312. The insulator 312 is further disposed upon a metal shield 316 which in turn is disposed upon an insulator 320 which is disposed upon a grounded plane 324 through ground connection 328. The chuck 308 is connected to ground through a capacitor 340 having a capacitance generally in the range of 20 pF to 0.2 pF, with a preferred value of approximately 10 pF, and a voltage range of ±5,000 V. An operational amplifier 350 connects the chuck 308 to the shield 316, and variable voltage source 360 with appropriate resistance 364 may be optionally engaged between the chuck 308 and ground utilizing an operator actuatable switch 368 to electrically couple the chuck 308 with the ground.

The embodiment 300 is conceptually more complicated than the embodiment 300 depicted in FIG. 4, however it seeks to achieve the same result; that being the prebiasing of the wafer surface to reduce the creation of tribocharges. It is recognized that a desire to obtain a 20 pF capacitance between a floating chuck and ground plane can be difficult where the chuck, and the wafer thereon, have a large diameter. The circuit depicted in FIG. 5 attempts to solve the size problem by including the shield 316 and operational amplifier 350 to reduce the size requirements to obtain a 20 pF capacitance. The shield 316 is basically an electrical follower of the chuck 308, and the design of embodiment 300 basically results in the coupling together of the chuck 308, shield 316 and ground plane 324, such that the chuck 308 is both capacitance-coupled and electrically coupled to the ground plane 324.

While the invention has been shown and described with reference to certain preferred embodiments, it is to be understood that certain alterations and modifications to the present invention will become apparent to those skilled in the art. The following claims are intended by the inventor to cover all such alterations and modifications that nevertheless include the true spirit and scope of the invention described herein.

What is claimed is:

1. A substrate support system for use in a cryogenic aerosol cleaning device, comprising:
    a substrate support member;
    an electrically grounded plane member;
    an insulator member being disposed between said plane member and said support member;
    said support member being capacitance-coupled to said plane member with a capacitance in the range of 20 pF to 0.2 pF.

2. A substrate support system as described in claim 1 wherein said capacitance is approximately 20 pF.

3. A substrate support system as described in claim 1 wherein said support member and said grounded plane member are electrically coupled together.

4. A substrate support system as described in claim 3 wherein a voltage creating device is engaged proximate said support member to apply a bias voltage to said support member.

5. A substrate support system as described in claim 4 wherein a biasing plate is disposed in a spaced-apart relationship relative to said support member; said plate having a biasing voltage applied thereto to create bias voltage to said support member.

6. A substrate support system as described in claim 1 wherein said insulator is disposed between said support member and said plate.

7. A substrate support system as described in claim 1 wherein a shield member is disposed between said plane member and said support member, said shield member being electrically conductive:
    said support member being electrically engaged to said shield member through an operational amplifier.

8. A substrate support as described in claim 7 wherein said support member is electrically coupled to said grounded plane member.

9. A substrate support as described in claim 8 wherein a voltage applying device is engaged to said support member and to said grounded plane to apply a bias voltage to said support member.

10. A cryogenic aerosol substrate cleaning system, comprising:
    an enclosure for cleaning a substrate therewithin;
    a substrate support system being disposed within said enclosure for supporting a substrate during a cleaning operation;
    a cryogenic aerosol spray cleaning device being disposed within said enclosure and functioning to direct a cryogenic aerosol cleaning spray to a surface of said substrate for the cleaning thereof;
    said substrate support system including:
    a substrate support member;
    an electrically grounded plane member;
    an insulator member being disposed between said plane member and said support member;
    said support member being capacitance-coupled to said plane member with a capacitance in the range of 20 pF to 0.2 pF.

11. A substrate cleaning system as described in claim 10 wherein said capacitance is approximately 20 pF.

12. A substrate cleaning system as described in claim 10 wherein said support member and said grounded plane member are electrically coupled together.

13. A substrate cleaning system as described in claim 12 wherein a voltage creating device is engaged proximate said support member to apply a bias voltage to said support member.

14. A substrate cleaning system as described in claim 13 wherein a biasing plate is disposed in a spaced-apart relationship relative to said support member; said plate having a biasing voltage applied thereto to create bias voltage to said support member.

15. A substrate cleaning system as described in claim 10 wherein said insulator is disposed between said support member and said plate.

16. A substrate cleaning system as described in claim 10 wherein a shield member is disposed between said plane member and said support member, said shield member being electrically conductive:

said support member being electrically engaged to said shield member through an operational amplifier.

17. A substrate cleaning system as described in claim 16 wherein said support member is electrically coupled to said grounded plane member.

18. A substrate cleaning system as described in claim 17 wherein a voltage applying device is engaged to said support member and to said grounded plane to apply a bias voltage to said support member.

19. A substrate cleaning system as described in claim 10, further including at least one charged particle producing device being disposed within said enclosure to direct charged particles towards said substrate.

* * * * *